United States Patent
Li

(10) Patent No.: US 11,193,307 B2
(45) Date of Patent: Dec. 7, 2021

(54) KEY, LOCK CORE AND LOCK

(71) Applicant: BOE TECHNOLOGY GROUP CO., LTD., Beijing (CN)

(72) Inventor: Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 356 days.

(21) Appl. No.: 16/444,039

(22) Filed: Jun. 18, 2019

(65) Prior Publication Data

US 2020/0058182 A1 Feb. 20, 2020

(30) Foreign Application Priority Data

Aug. 15, 2018 (CN) .......................... 201810929402.8

(51) Int. Cl.
*E05B 47/00* (2006.01)
*E05B 49/00* (2006.01)
(Continued)

(52) U.S. Cl.
CPC .......... *E05B 47/0011* (2013.01); *E05B 19/00* (2013.01); *E05B 35/00* (2013.01);
(Continued)

(58) Field of Classification Search
CPC ........ E05B 19/00; E05B 35/00; E05B 35/008; E05B 47/0011; E05B 49/00;
(Continued)

(56) References Cited

U.S. PATENT DOCUMENTS 3,979,647 A * 9/1976 Perron ...................... G07C 9/29
70/277
4,250,533 A * 2/1981 Nelson ............... G07C 9/00309
340/5.25
(Continued)

FOREIGN PATENT DOCUMENTS

CN 202611358 12/2012
CN 103198551 7/2013
(Continued)

OTHER PUBLICATIONS

Chinese Patent Office Action dated Jul. 14, 2020 corresponding to Chinese Patent Application No. 201810929402.8; 30 pages.
(Continued)

*Primary Examiner* — Christopher J Boswell
(74) *Attorney, Agent, or Firm* — Leason Ellis LLP

(57) ABSTRACT

A key, a lock core and a lock, relating to a key, a lock core and a lock are provided. The key includes: a column body, a first end of the column body being provided with a light emitting component; a first cathode component disposed on the column body and connected to one end of the light emitting component to be mated with a second cathode component in the lock core; a first piezoelectric electrode disposed on the column body and connected to the other end of the light emitting component to be pressed against a second piezoelectric electrode in the lock core. When the first cathode component is mated with the second cathode component in the lock core, and the first piezoelectric electrode is pressed against the second piezoelectric electrode in the lock core, a piezoelectric current is generated, to cause the light emitting component to emit light.

20 Claims, 6 Drawing Sheets

(51) Int. Cl.
    *G06K 9/00*     (2006.01)
    *H01L 41/04*     (2006.01)
    *E05B 19/00*     (2006.01)
    *E05B 35/00*     (2006.01)
    *G02B 19/00*     (2006.01)
    *G07C 9/00*     (2020.01)
    *H01L 41/047*     (2006.01)

(52) U.S. Cl.
    CPC ........ *E05B 49/006* (2013.01); *G02B 19/0009* (2013.01); *G02B 19/0061* (2013.01); *G07C 9/00658* (2013.01); *G07C 9/00714* (2013.01); *H01L 41/047* (2013.01); *E05B 2047/005* (2013.01); *E05B 2047/0083* (2013.01); *E05B 2047/0084* (2013.01); *G06K 9/00006* (2013.01); *H01L 41/042* (2013.01)

(58) Field of Classification Search
    CPC ................ E05B 49/002; E05B 49/006; E05B 2047/0048; E05B 2047/005; E05B 2047/0072; E05B 2047/0082; E05B 2047/0083; E05B 2047/0084; G07C 9/00658; G07C 9/00706; G07C 9/00714; G07C 2009/00753; G07C 2009/00769; G07C 2009/00777; G07C 2009/00785; G02B 19/0009; G02B 19/0061; G06K 9/00006; H01L 41/04; H01L 41/042; H01L 41/047
See application file for complete search history.

(56) References Cited

U.S. PATENT DOCUMENTS

| | | | |
|---|---|---|---|
| 6,411,195 B1 * | 6/2002 | Goldman | G07C 9/00182 340/5.1 |
| 6,865,916 B2 * | 3/2005 | Goldman | E05B 47/0615 70/279.1 |
| 7,000,441 B2 * | 2/2006 | Sutton | E05B 47/0623 70/276 |
| 9,938,751 B2 * | 4/2018 | Chow | E05B 47/0623 |
| 2009/0013736 A1 * | 1/2009 | Voosen | E05B 47/0011 70/277 |
| 2010/0236306 A1 * | 9/2010 | Trempala | E05B 47/063 70/277 |
| 2012/0047972 A1 * | 3/2012 | Grant | E05B 45/00 70/77 |
| 2016/0032623 A1 * | 2/2016 | DeWalch | E05B 47/0009 70/278.2 |
| 2018/0087291 A1 | 3/2018 | Seok et al. | |

FOREIGN PATENT DOCUMENTS

| | | |
|---|---|---|
| CN | 105844743 | 8/2016 |
| CN | 107869279 | 4/2018 |
| EP | 0339102 | 11/1989 |
| GB | 2190700 | 11/1987 |

OTHER PUBLICATIONS

Beijing Institute of Technology Press, Application and Practice of Basic Electrician Skills; 9 pages.

* cited by examiner

KEY, LOCK CORE AND LOCK

CROSS-REFERENCE TO RELATED APPLICATION

The present application claims priority of the Chinese Patent Application No. 201810929402.8, filed on Aug. 15, 2018, the disclosure of which is incorporated herein by reference in its entirety as part of the present application.

TECHNICAL FIELD

The present disclosure relates to the field of visible light communication technologies, and in particular, to a key, a lock core and a lock.

BACKGROUND

Visible light communication is a communication method in which light waves are used as a transmission medium, and information is transmitted through a high-speed flickering signal that is invisible to naked eyes, such as a fluorescent lamp or a light-emitting diode. Visible light is a kind of green resource. Visible light communication does not cause electromagnetic radiations. The advantage thereof may include the following aspects: communication can be performed as long as there is light, without any communication blind zone; the visible light communication has a high transmission power, and no need for radio spectrum authentication; it has a wide transmission bandwidth, large communication capacity, excellent confidentiality and strong capability for anti-electromagnetic interference. Visible light communication techniques can be applied to door locks.

An access control system based on visible light communication may include a photon key and a light control door lock. The photon key is provided with unlocking password information. When the light control door lock is turned on, the photon key transmits the unlocking password information to the light control door lock in form of a light signal. After the door lock receives the signal, it performs the door opening action. For the user's convenience, a mobile phone can be used to emit visible light. That is, the phone serves as a photonic key.

However, whether a mobile phone is used as a photonic key or an ordinary photon key is used, a battery is needed as a power source. When the battery power is exhausted, neither of the mobile phone nor the ordinary photon key can perform unlocking action, which may bring a certain trouble to the user, and present a poor user experience.

SUMMARY

In one aspect of the present disclosure, a key is provided, including: a column body configured to be mated with a lock hole of a lock core; a light emitting component disposed at a first end of the column body; a first cathode component disposed on the column body and connected to the first end of the light emitting component and configured to be mated with a second cathode component in the lock core; and at least one first piezoelectric electrode disposed on the column body and connected to a second end of the light emitting component, and configured to be pressed against a second piezoelectric electrode in the lock core; wherein, when the first cathode component is mated with the second cathode component in the lock core, and the first piezoelectric electrode is pressed against the second piezoelectric electrode in the lock core, a closed circuit is formed and a piezoelectric current is generated, to drive the light emitting component to emit light.

In an embodiment, the first cathode component is disposed on the column body and between the first piezoelectric electrode and the second end of the column body, and the second end of the column body is opposite to the first end.

In an embodiment, the key includes a plurality of first piezoelectric electrodes, and the first piezoelectric electrodes are disposed with intervals around the column body.

In an embodiment, the at least one first piezoelectric electrode is a flange disposed around the circumference of the outer surface of the column body.

In an embodiment, the at least one first piezoelectric electrode is connected to the column body in an elastically contractible manner, and the first piezoelectric electrode can be contracted toward the inside of the column body under pressure.

In an embodiment, the key further includes: a first guiding structure disposed between the first piezoelectric electrode and an end of the first end of the column body, and configured to match a second guiding structure in the lock core.

In an embodiment, the first piezoelectric electrode is provided with an elastic member for elastically supporting between the first piezoelectric electrode and the second piezoelectric electrode.

In an embodiment, the key further includes: a control chip disposed in the column body, wherein an input end of the control chip is connected to the first piezoelectric electrode, and an output end of the control chip is connected to the light emitting component.

In an embodiment, the key further includes: a transformer unit including a rectifying component and a filtering component, wherein one input end of the transformer unit is connected to the first piezoelectric electrode, and the other input end of the transformer unit is for connecting to the second piezoelectric electrode of the lock core, one output end of the transformer unit is connected to the first cathode component, and the other output end of the transformer unit is for connecting to the second cathode component of the lock core; and a storage capacitor connected between the first cathode component and the first piezoelectric electrode.

In an embodiment, the key further includes: a fingerprint identification component disposed at a second end of the column body, wherein the fingerprint identification component is connected between the first piezoelectric electrode and the first cathode component.

In an embodiment, the key further includes: a condensing lens disposed on a surface of the light emitting component such that light emitted by the light emitting component is irradiated in the lock core.

In another aspect of the present disclosure, a lock core is provided, including: a body, provided with a lock hole, the lock hole being configured to be mated with a column body of a key; a photo sensor disposed at a bottom of the lock hole; a second cathode component disposed on an inner wall of the lock hole and configured to be mated with a first cathode component on the key; and at least one second piezoelectric electrode having a polymer insulating layer disposed on a surface thereof, disposed on an inner wall of the lock hole, connected to the second cathode component, and configured to be pressed against a first piezoelectric electrode on the key; wherein, when the second cathode component is mated with the first cathode component in the lock core, and the second piezoelectric electrode is pressed against the first piezoelectric electrode of the key, a closed circuit is formed and a piezoelectric current is generated, to drive the light emitting component of the key to emit light, the light signal is received by the photo sensor and converted to a control signal to be output to the lock for controlling the locking and unlocking of the lock.

In an embodiment, the second cathode component is disposed on the inner wall of the lock hole and between the second piezoelectric electrode and an opening of the lock hole.

In an embodiment, the lock core includes a plurality of second piezoelectric electrodes, and the plurality of second piezoelectric electrodes are disposed with intervals around the inner wall of the lock hole.

In an embodiment, the plurality of second piezoelectric electrodes is a flange disposed around the circumference of the inner wall of the lock hole.

In an embodiment, the at least one second piezoelectric electrode is connected to the inner wall of the lock hole in an elastically contractible manner, and can be contracted toward the inside of the inner wall of the lock hole under pressure.

In an embodiment, the lock core further includes: a second guiding structure disposed between the second piezoelectric electrode and the open end of the lock hole, and configured to match a first guiding structure on the key.

In an embodiment, the lock core further includes: a control chip disposed in the body, wherein an input end of the control chip is connected to the second piezoelectric electrode, and an output end of the control chip is connected to the second cathode component.

In an embodiment, the lock core further includes: a transformer unit including a rectifying component and a filtering component, wherein one input end of the transformer unit is connected to the second piezoelectric electrode, and the other input end of the transformer unit is for connecting to the first piezoelectric electrode of the key, one output end of the transformer unit is connected to the second cathode component, and the other output end of the transformer unit is for connecting to the first cathode component of the key; and a storage capacitor connected between the second cathode component and the second piezoelectric electrode.

In yet another aspect of the present disclosure, a lock core is provided, including: the lock core described above.

DETAILED DESCRIPTION

In order to further explain the technical means and functions of the present disclosure for achieving the intended object of the present disclosure, the key, the lock core and the lock, as well as their specific implementations, structures, features and functions according to the present disclosure will be described in detail below with reference to the accompanying drawings and preferred embodiments. In the following description, different "an embodiment" or "the embodiment" does not necessarily mean the same embodiment. Furthermore, the particular features, structures, or characteristics of one or more embodiments can be combined in any suitable form.

Figure 1:
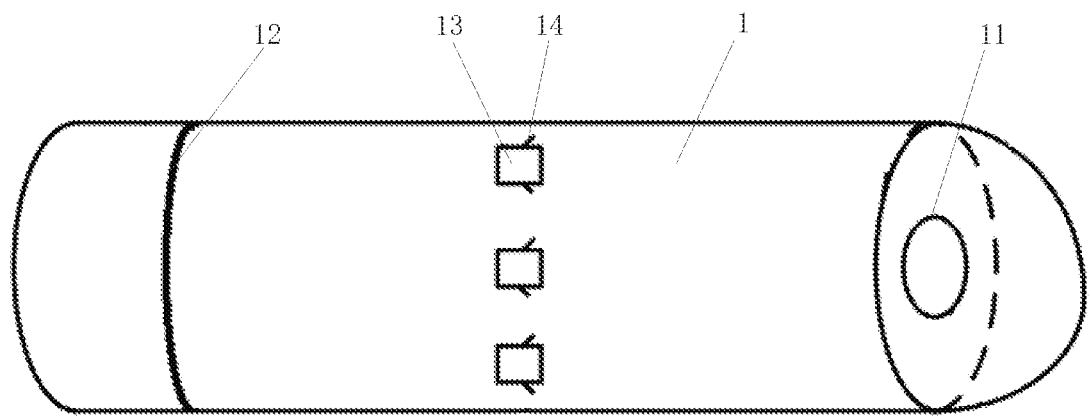
FIG. 1 is a schematic structural diagram of a key according to an embodiment of the present disclosure.
Figure 3:
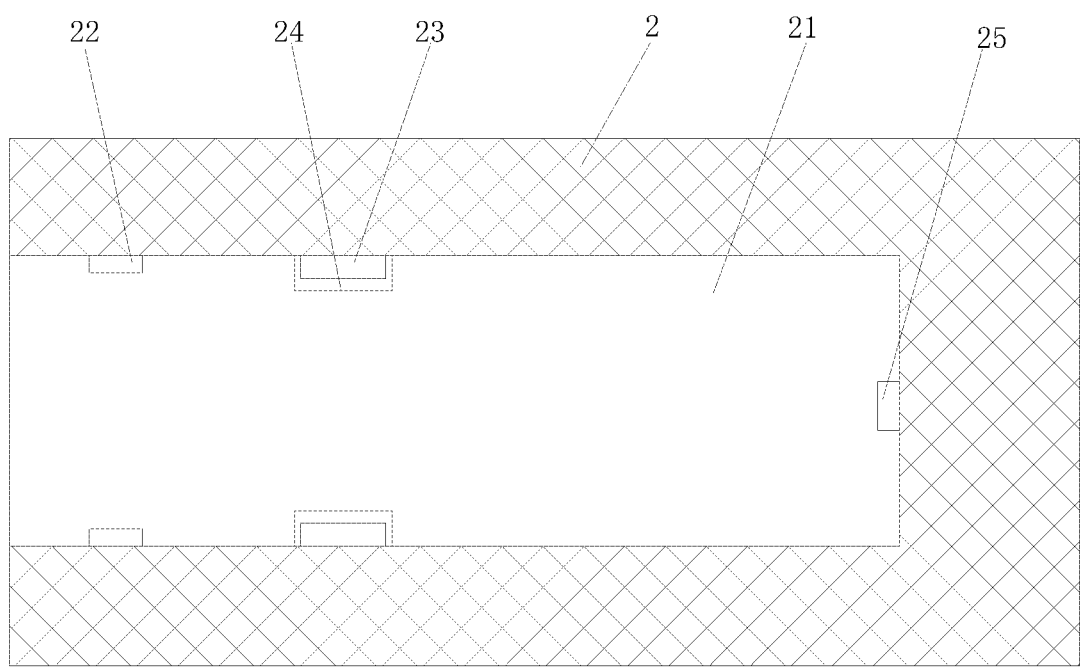
FIG. 3 is a schematic structural diagram of a lock core according to an embodiment of the present disclosure.
Figure 5:
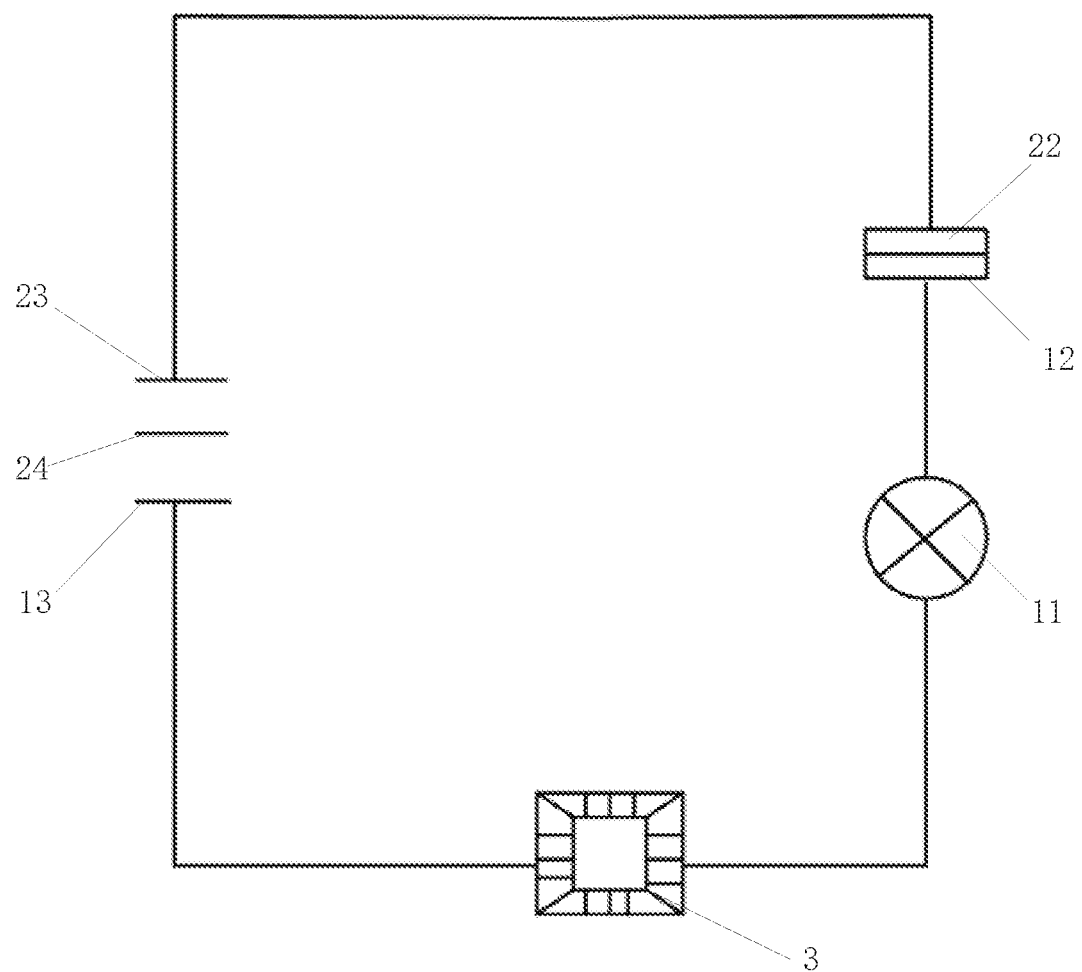
FIG. 5 is a schematic diagram of an electrical connection structure of a closed circuit composed of a key and a lock core mating together according to an embodiment of the present disclosure.

As shown in FIG. 1, FIG. 3 and FIG. 5, a key according to an embodiment of the present disclosure includes: a column body 1, a first cathode component 12, and a first piezoelectric electrode 13. The column body 1 is configured to be mated with a lock hole 21 of the lock core. A first end of the column body 1 is provided with a light emitting component 11. The first cathode component 12 is disposed on the column body 1 and connected to one end of the light emitting component 11, and configured to be mated with a second cathode component 22. The first piezoelectric electrode 13 is disposed on the column body 1 and is connected to the other end of the light emitting component 11, and configured to press against a second piezoelectric electrode 23 in the lock core. When the first cathode component 12 is mated with the second cathode component 22 in the lock core, the first piezoelectric electrode 13 is pressed against the second piezoelectric electrode 23 in the lock core, to form a closed circuit and generate a piezoelectric current for causing the light emitting component 11 to emit light.

The column body 1 can be a column body of any shape, for example, circular, rectangular, triangular or other polygonal cross-section, as long as the column body 1 can be inserted into the lock hole 21 of the lock core for convenient use. In the embodiment, an elongated column body 1 is taken as an example. The column body 1 can be a hollow cylindrical shell, the interior of which is used to accommodate connecting wires, chips, and other mounting structures. The column body 1 can be made of a plastic material or a metal material, but it is required to be insulated from the first piezoelectric electrode 13 and the first cathode component 12 when it is made of a metal material. The first cathode component 12 can be made of a common metal material or a material dedicated to form a cathode. The first cathode component 12 can be a metal bump, a metal elastic piece, a metal contact disposed on the sidewall of the column body 1, or any metal conductive structure that facilitates mating with the second cathode component 22 in the lock core. The first cathode component 12 is disposed on the column body 1 at a distance from the first piezoelectric electrode 13 to prevent short-circuiting there between.

It should also be noted that the disposition position of the first cathode component 12 on the column body 1 needs to match the disposition position of the second cathode component 22 in the lock core. That is, when the key is inserted into the lock hole 21 of the lock core, the first cathode component 12 is brought into contact with the second cathode component 22 of the lock core. In addition, in order that the first cathode component 12 on the key can mate well with the second cathode component 22 in the lock core when the key is inserted into the lock core, they can be configured as a groove and a bump, respectively.

The light emitting component 11 can be any component that emits visible light under the action of a current, such as an LED light. In order to facilitate the use of the key, the light emitting component 11 can be disposed at the first end of the column body 1, that is, the end which needs to be inserted into the lock hole 21 of the lock core when unlocked. A surface of the light emitting component 11 can also be provided with a condensing lens to ensure that the light signal emitted by the light emitting component 11 can be directly irradiated into the lock core.

The first piezoelectric electrode 13 is disposed on the sidewall of the column body 1, and the manufacturing material can be Al, CU, etc., and the disposition position needs to match the disposition position of the second piezoelectric electrode 23 in the lock core. That is, when the key is inserted into the lock core, the first piezoelectric electrode 13 is pressed against the second piezoelectric electrode 23. The first piezoelectric electrode 13 can have any shape as long as it can be pressed against the second piezoelectric electrode 23 in the lock core, and can be, for example, a ring shape, a dot shape, a block shape or the like. In addition, the first piezoelectric electrode 13, the light emitting component 11, and the first cathode component 12 need to be connected in series in sequence, and the specific connection manner can be connected by a connecting wire.

In the solution of the present disclosure, the key as disclosed is provided with a first cathode component, a first piezoelectric electrode and a light emitting component. When the key is inserted into the lock core, the first cathode component is mated with the second cathode component in the lock core, and the first piezoelectric electrode is pressed against the second piezoelectric electrode of the lock core, to form a closed circuit and generates a piezoelectric current, such that the light emitting component operates and emits a light signal, thereby the light signal can be received by a photosensitive sensing device in the lock core, converted into a control signal and output to the lock to control the locking and unlocking of the lock. The key according to the present disclosure generates current through the contact of the piezoelectric electrodes, and does not need a power source. It can solve the problem in the related art that the key cannot be unlocked when the battery of a mobile phone or a key is exhausted, and it can bring better user experience.

Figure 2:
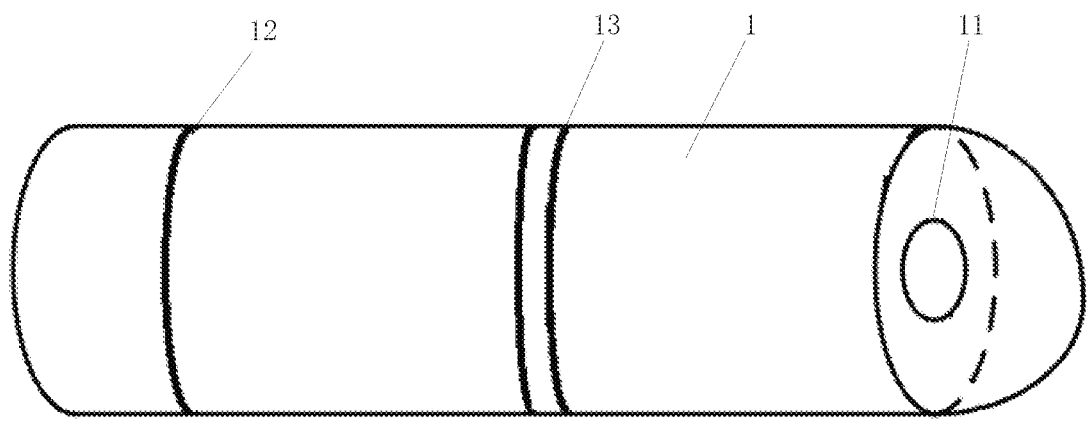
FIG. 2 is a schematic structural diagram of another key according to an embodiment of the present disclosure.

As shown in FIGS. 1-3, the second end of the column body 1 is opposite to the first end, and the first cathode component 12 is disposed between the first piezoelectric electrode 13 and the second end of the column body 1.

Since the piezoelectric current has to be generated to enable the key to emit a light signal for unlocking, when the first piezoelectric electrode 13 is configured to protrude from the side surface of the column body 1, the first cathode component 12 needs to be closer to the second end of the column body 1 (that is, the end exposed outside the lock core for the user to hold when the key is inserted into the lock hole 21 of the lock core) than the first piezoelectric electrode 13 to the column body 1, to ensure that the key can be smoothly inserted into the lock core.

Optionally, the number of the first piezoelectric electrodes 13 can be one or more, and the plurality of first piezoelectric electrodes 13 can be disposed with intervals across a circumference of a side surface (in the same cross section) of the column body 1. Alternatively, the first piezoelectric electrode 13 can be a flange disposed around the circumference of the outer surface of the column body 1.

When a plurality of first piezoelectric electrodes 13 are provided, the plurality of first piezoelectric electrodes 13 can be a plurality of convex structures such as bumps. The number and positions of the second piezoelectric electrodes 23 disposed in the lock core match those of the first piezoelectric electrodes 13. The plurality of first piezoelectric electrodes 13 can be disposed around the circumference of the column body 1 and can be disposed along a circumference of the same cross section. Alternatively, they can be disposed along a circumference not on the same cross section, and can be designed according to specific needs.

When the first piezoelectric electrodes 13 are disposed in an annular structure, the shape of the first piezoelectric electrodes 13 matches the cross-sectional shape of the column body 1 so as to better match the second piezoelectric electrode 23 in the lock core, and facilitate the pressing action.

Optionally, in order to enable the first piezoelectric electrode 13 on the key to be accurately pressed against the second piezoelectric electrode 23 in the lock core, that is, the first piezoelectric electrode 13 can be accurately pressed against the second piezoelectric electrode 23 when the key is inserted into the lock core to unlock it, a first guiding structure (not shown) can be provided on the column body 1. The first guiding structure can be disposed between the first piezoelectric electrode 13 and the first end of the column body 1, to be mated with a second guiding structure (not shown) in the lock core.

The first guiding structure can be a guiding groove or a guide rail provided on a side surface of the column body 1.

As an example, the first piezoelectric electrode 13 can be connected to the column body 1 in an elastically contractible manner, and the first piezoelectric electrode 13 can be contracted toward the inside of the column body 1 under pressure.

As another example, the first piezoelectric electrode 13 can adopt a conventional elastic convex structure, for example, a receiving groove is provided on a side surface of the column body 1, the first piezoelectric electrode 13 is disposed in the receiving groove, and an elastic member is disposed between the first piezoelectric electrode 13 and the receiving groove, such that when the first piezoelectric electrode 13 is pressed, the first piezoelectric electrode 13 can be contracted toward the inside of the column body 1. Accordingly, the structure of the second piezoelectric electrode 23 disposed in the lock core is also elastically contractible.

In the present disclosure, the distance from the first cathode component 12 or the first piezoelectric electrode 13 to the second end of the column body 1 is not specially limited.

Figure 4:
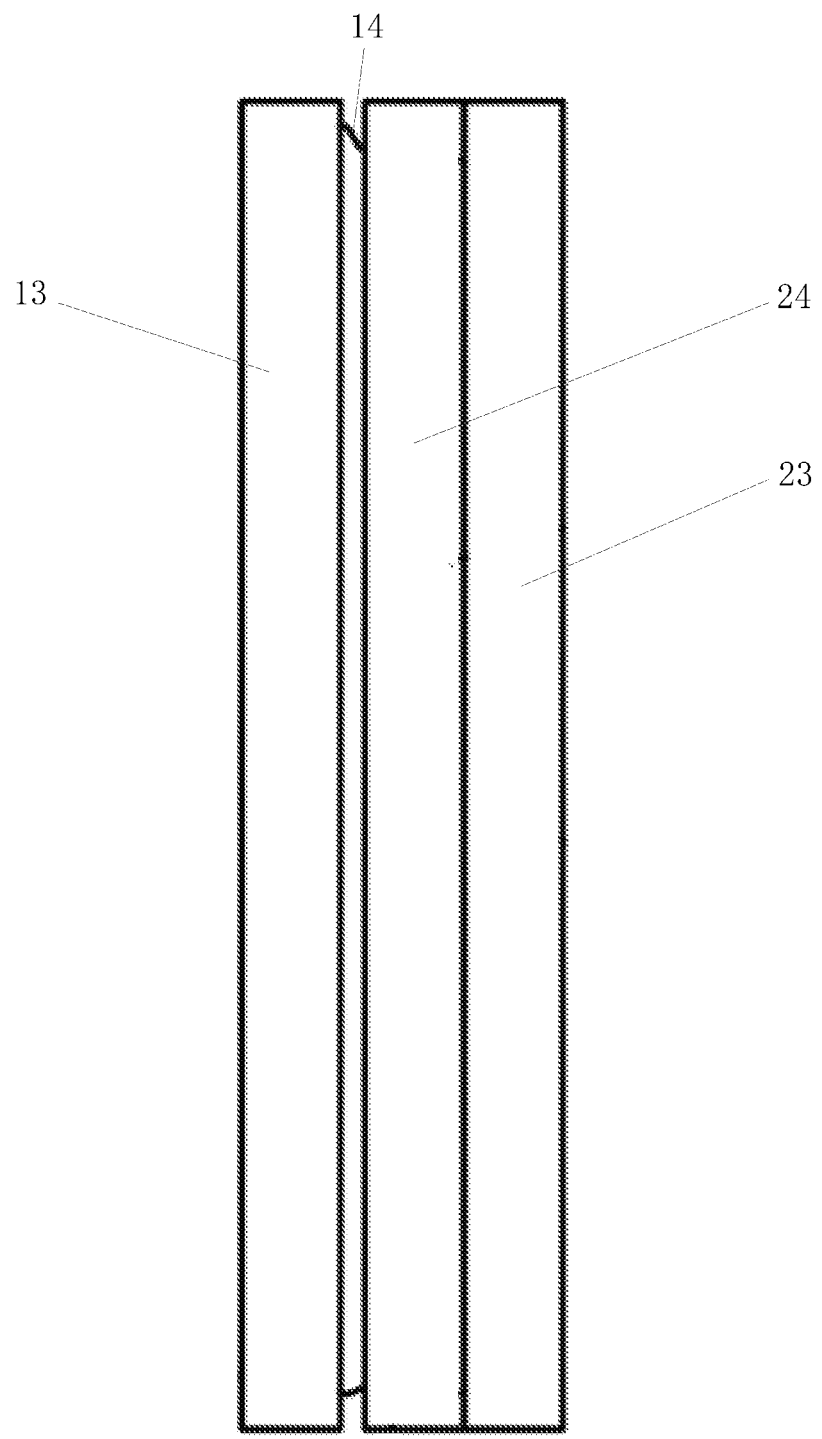
FIG. 4 is a schematic structural diagram of a first piezoelectric electrode in a key pressed against a second piezoelectric electrode in a lock core according to an embodiment of the present disclosure.

As shown in FIG. 1 and FIG. 4, in a specific implementation, the first piezoelectric electrode 13 is provided with an elastic member 14 for elastically supporting between the first piezoelectric electrode 13 and the second piezoelectric electrodes 23.

The elastic member 14 can be an elastic piece, and mainly functions for elastically supporting, and for providing buffering when the user presses the first piezoelectric electrode 13 against the second piezoelectric electrode 23. During the pressing, the elastic member 14 is pressed against a polymer insulating layer 24 on the surface of the second piezoelectric electrode 23.

As shown in FIG. 5, in a specific implementation, the key according to the embodiment of the present disclosure further includes: a control chip 3. The control chip 3 is disposed in the column body 1, having an input end connected to the piezoelectric electrode 13 and an output end connected to the light emitting component 11.

The control chip 3 is a component for implementing the control of the light emitting component 11 to emit a specific light signal, which can be pre-programmed with a control logic, then disposed in the column body 1 of the key, and connected to a circuit constituted by the first piezoelectric electrode 13, the light emitting component 11 and the first cathode component 12. Alternatively, a connection end for connecting the control chip 3 can be disposed on the second end of the column body 1, and then the control logic is written in the control chip 3 after the key is produced and assembled. In addition, the control chip 3 can be disposed in the lock core and connected between the second cathode component 22 and the second piezoelectric electrode 23 of the lock core.

Figure 7:
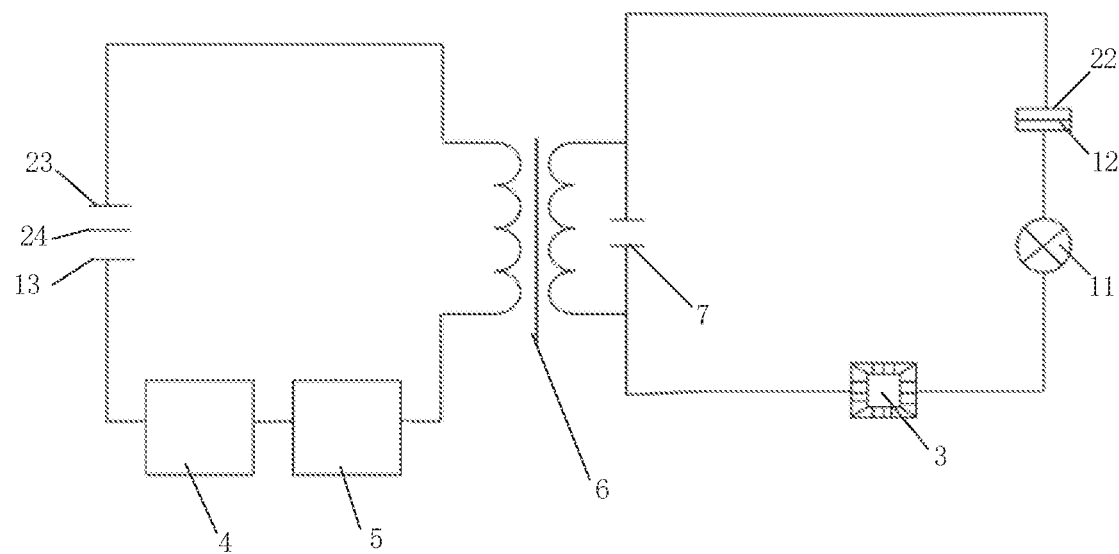
FIG. 7 is a schematic diagram of an electrical connection structure of another closed circuit composed of a key and a lock core mating together according to an embodiment of the present disclosure.

As shown in FIG. 7, the key according to the embodiment of the present disclosure further includes: a rectifying component 4 and a filtering component 5, and the rectifying component 4 and the filtering component 5 are connected in series between the first cathode component 12 and the first piezoelectric electrode 13.

The rectifying component 4 can be composed of half-wave rectification or full-wave rectification or bridge rectification. Its function is to convert an alternating current into a direct current (AC/DC conversion). The circuit of the rectifying component 4 is a circuit to convert an AC voltage change between positive and negative to a one-way pulsating voltage by utilizing the unidirectional conductivity of the diode.

The filtering component 5 filters the current output by the rectifying component 4 to remove ripple such that the waveform of the output current becomes as straight as possible.

Optionally, a capacitor can be connected to the output end of the filtering component 5, and the charging and discharging characteristics of the capacitor are utilized to charge when the pulsating current reaches a peak value, and discharge when the pulsating current falls to the bottom of the curve, to supplement the current output, such that the current waveform output to the light emitting component 11 can be straighter.

As shown in FIG. 7, the key according to the embodiment of the present disclosure further includes: a transformer unit 6 and a storage capacitor 7. The transformer unit 6 has one input end connected to the first piezoelectric electrode 13, the other input end for connecting to the second piezoelectric electrode 23 of the lock core, one output end connected to the first cathode component 12, and the other output end for connecting to the second cathode component 22 of the lock core. A storage capacitor 7 is connected between the first cathode component 12 and the first piezoelectric electrode 13.

Through the voltage regulating function of the transformer unit 6, the voltage can be adjusted to a suitable output voltage (1-3V) to meet the requirements of driving the light emitting component 11. The storage capacitor 7 can store electric energy and drive the load, that is, meet the driving requirements of the control chip 3 and the light emitting component 11. Thus, it can solve the problems that the current is unstable or the power may be insufficient.

Optionally, the key of the embodiment of the present disclosure can further include: a fingerprint identification component disposed at the second end of the column body 1. The fingerprint identification component is connected between the first piezoelectric electrode 13 and the first cathode component 12.

In order to improve the security of the key, a fingerprint identification component can be provided on the column body 1 of the key such that only the user who has previously entered the fingerprint can use the key and make the key to emit a light signal.

Alternatively, a number-of-pressing-times verification program can be written in the control chip 3. When the user inserts a key into the lock core and presses the first piezoelectric electrode 13 against the second piezoelectric electrode 23 to generate a current, it is necessary to perform a pressing operation according to the number of pressing times required in the program written into the control chip 3 in advance. For example, the number of pressing times being 3 times of pressing is written in the control chip 3, and in this case, the first piezoelectric electrode 13 has to be pressed against the second piezoelectric electrode 23 for three (3) times, to make the control chip 3 to drive the light emitting component 11 to emit a specific light signal, thereby perform unlocking operation. Such a setting can provide an anti-theft function, because only the user who knows that the number of pressing times is 3 times can perform unlocking.

As shown in FIGS. 1-3, another embodiment of the present disclosure provides a lock core including: a body 2, the second cathode component 22, and the second piezoelectric electrode 23. The body 2 is provided with the lock hole 21. The lock hole 21 is configured to be mated with the column body 1 of the key. The bottom of the lock hole 21 is provided with a photosensitive sensing device 25. The second cathode component 22 is disposed on the inner wall of the lock hole 21 and configured to be mated with the first cathode component 12 on the key. The surface of the second piezoelectric electrode 23 is provided with a polymer insulating layer 24, and the second piezoelectric electrode 23 is disposed on the inner wall of the lock hole 21 and connected to the second cathode component 22, and configured to be pressed against the first piezoelectric electrode 13 on the key. When the second cathode component 22 is mated with the first cathode component 12 of the key, and the second piezoelectric electrode 23 is pressed against the first piezoelectric electrode 13 of the key, a closed circuit is formed and a piezoelectric current is generated. The light emitting component 11 of the key emits a light signal, and the photosensitive sensing device 25 receives the light signal and converts it into a control signal output to the lock for controlling the locking and unlocking of the lock.

The lock core is the main component that is disposed inside the lock and is used to control the unlocking and locking of the lock. The body 2 of the lock core needs to be provided with a lock hole 21 matching the key structure. Then, a second piezoelectric electrode 23 matching the first piezoelectric electrode 13 on the key, and the second cathode component 22 matching the first cathode component 12 on the key are disposed on the inner wall of the lock hole 21. The photosensitive sensing device 25 disposed at the bottom of the lock hole 21 is a device configured to receive the light signal of the key, and can convert the light signal containing the unlocking information transmitted by the key to a control signal for controlling the unlocking of the lock, and transmit the control signal to the lock. The power supply of the photosensitive sensing device 25 can be derived from the electric energy generated by the pressing of the first piezoelectric electrode 13 against the second piezoelectric electrode 23, or can be derived from the power supply of the lock. The specific structure of the second cathode component 22 can be the same as that of the first cathode component 12, and the materials are the same. The specific structure of the second piezoelectric electrode 23 can be the same as that of the second piezoelectric electrode 23, and the materials are the same, which will not be described again. However, it should be noted that the surface of the second piezoelectric electrode 23 needs to be provided with the polymer insulating layer 24, such that when the first piezoelectric electrode 13 is pressed against the second piezoelectric electrode 23, the frictional action and the electrostatic induction effect between the organic film of the first piezoelectric electrode 13 and the second piezoelectric electrode 23 and the polymer insulating layer 24 cause an opposite charge to be generated on the two piezoelectric electrodes and the polymer insulating layer 24, respectively. At this time, through the guiding by the wires connecting the two cathode components, it is equivalent to forming a battery structure, and the generated electric energy can drive the light emitting component 11 on the key to emit a light signal. The material of the second piezoelectric electrode 23 can be Al, CU or the like, and the polymer insulating layer 24 can be polytetrafluoroethylene (PTFE).

The lock core according to the embodiment of the present disclosure is provided with a second cathode component, a second piezoelectric electrode and a photosensitive sensing device. When the key is inserted into the lock core, the second cathode component can be mated with the first cathode component of the key. The second piezoelectric electrode can be pressed on the first piezoelectric electrode of the key to form a closed circuit and generate a piezoelectric current, and the light emitting component can operate and emit a light signal, thereby the light signal can be received by a photosensitive sensing device in the lock core, converted into a control signal and output to the lock to control the locking and unlocking of the lock. Accordingly, the lock core according to the present disclosure generates current through the contact of the piezoelectric electrodes, and does not need a power source. It can solve the problem in the related art that the key cannot be unlocked when the battery of a mobile phone or a key is exhausted, and it can bring better user experience.

As shown in FIGS. 1-3, in a specific implementation, the second cathode component 22 is disposed at an inner wall of the lock hole 21 at a position closer to the opening of the lock hole 21 than the second piezoelectric electrode 23 to the opening.

The second cathode component 22 can be disposed close to the opening of the lock hole 21 to allow the key to be smoothly inserted into the lock hole 21. The position of the second cathode component 22 in the lock hole 21 matches that of the first cathode component 12 on the key, and the position of the second piezoelectric electrode 23 in the lock hole 21 has to match the position of the second piezoelectric electrode 23 on the key.

The number of the second piezoelectric electrodes 23 of the present disclosure can be one or more, and the plurality of the second piezoelectric electrodes 23 can be disposed with intervals across a circumference of the inner wall (in the same cross section) of the lock hole 21. Alternatively, the second piezoelectric electrode 23 can be a flange disposed around the circumference of the inner wall of the lock hole 21.

In order to make the second piezoelectric electrode 23 to be well pressed against the first piezoelectric electrode 13, when the second piezoelectric electrode 23 is plural, it is necessary to provide a plurality of convex structures, such as bumps, and the number and shape of the second piezoelectric electrodes 23 in the lock core match those of the first piezoelectric electrodes 13. The plurality of second piezoelectric electrodes 23 can be disposed around the circumference of the inner wall of the lock hole 21 and can be disposed along a circumference of the same cross section or not on the same cross section, and can be designed according to specific needs. When the second piezoelectric electrodes 23 are provided in an annular structure, it needs to match the sectional shape of the lock hole 21. In this case, the second piezoelectric electrode 23 can be better match the first piezoelectric electrodes 13 on the key, and it can facilitate the pressing operation.

In order to enable the first piezoelectric electrode 13 on the key to be accurately pressed against the second piezoelectric electrode 23 in the lock core, that is, the first piezoelectric electrode 13 can be accurately pressed against the second piezoelectric electrode 23 when the key is inserted into the lock core to unlock it, a second guiding structure can be provided in the lock hole 21. The second guiding structure can be disposed between the second piezoelectric electrode 23 and the opening end of the lock hole 21 for matching the first guiding structure on the key.

The second guiding structure can be a guide rail or a guiding groove provided on the inner wall of the lock hole 21.

The second piezoelectric electrode 23 can be connected to inner wall of the lock hole 21 in an elastically contractible manner, and the second piezoelectric electrode 23 can be contracted toward the inner wall of the lock hole 21 by the pressure.

The second piezoelectric electrode 23 can adopt a conventional elastic convex structure. For example, a receiving groove is provided on the inner wall of the lock hole 21, the second piezoelectric electrode 23 is disposed in the accommodating groove, and an elastic member is disposed between the two, such that when the second piezoelectric electrode 23 is pressed, the second piezoelectric electrode 23 is capable of contracting into the inner wall of the lock hole 21. Correspondingly, the structure of the first piezoelectric electrode 13 disposed on the key is also elastically contractible. The distance from the second cathode component 22 or the second piezoelectric electrode 23 on the inner wall of the lock hole 21 to the opening of the lock hole 21 may not be limited.

Figure 6:
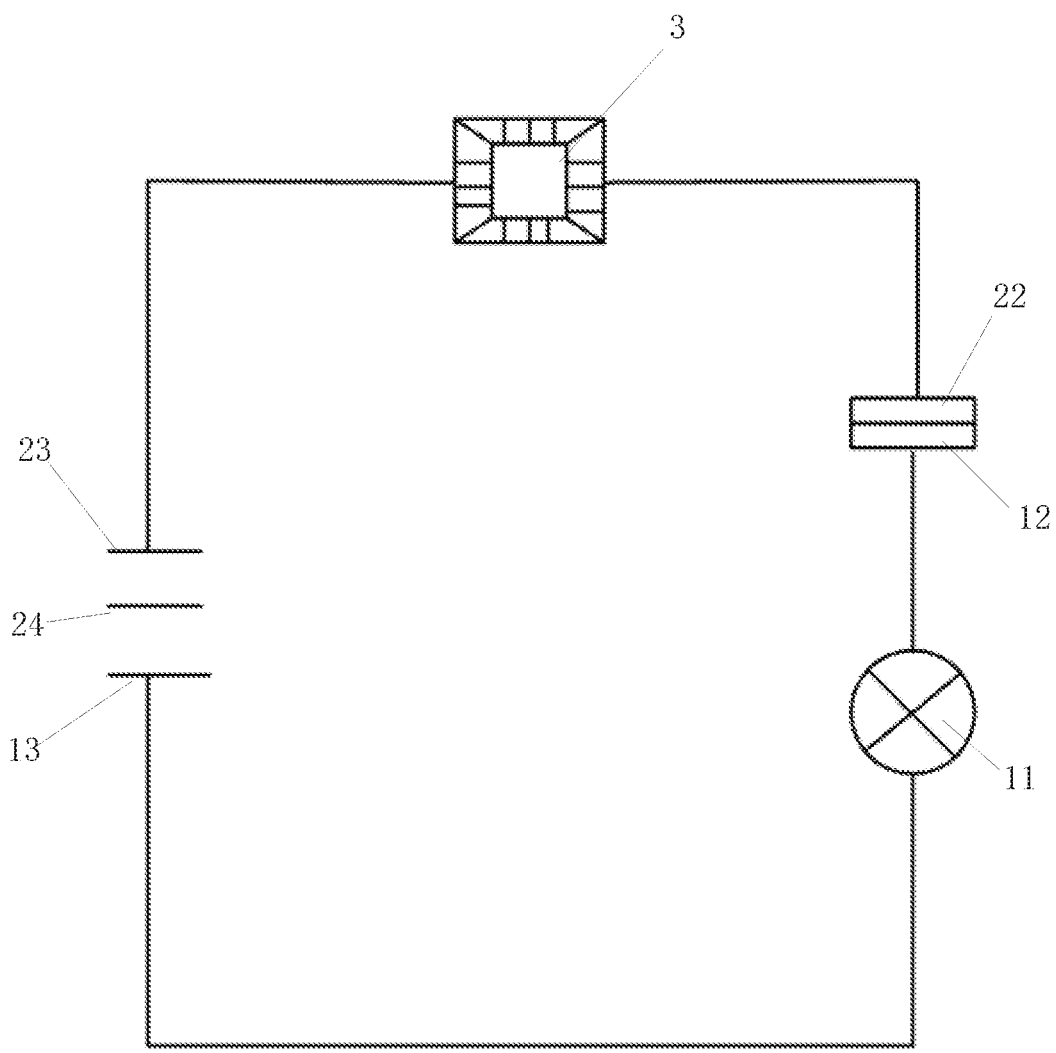
FIG. 6 is a schematic diagram of an electrical connection structure of another closed circuit composed of a key and a lock core mating together according to an embodiment of the present disclosure.

As shown in FIG. 6, the lock core according to the embodiment of the present disclosure further includes: a control chip 3, that is, the control chip 3 can also be disposed in the body 2 of the lock core. The control chip 3 has an input end connected to the second piezoelectric electrode 23, and an output end connected to the second cathode component 22.

The functions and effects of the control chip 3 have been described in the above embodiments, and are not described herein again.

Figure 8:
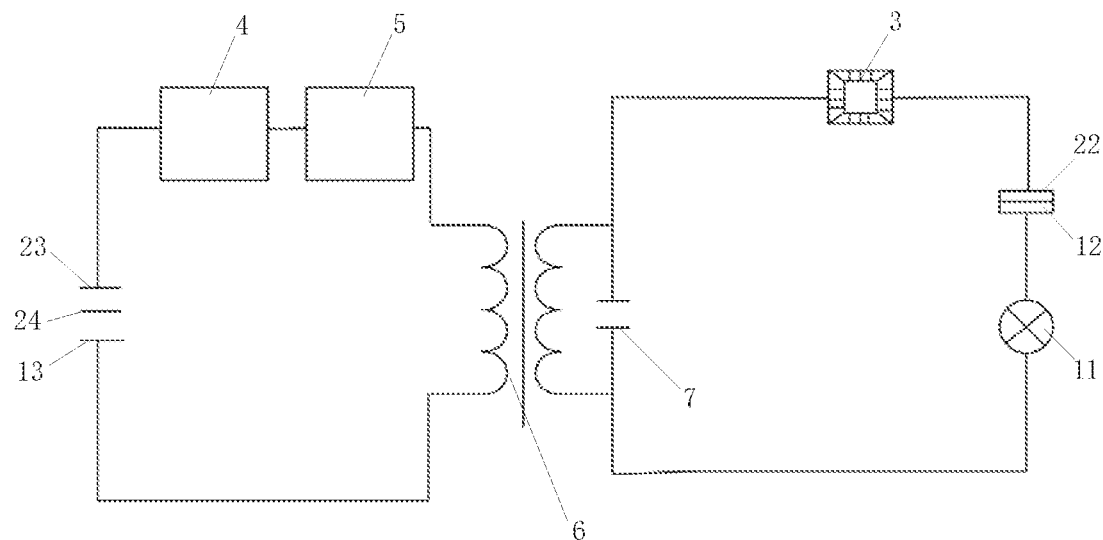
FIG. 8 is a schematic diagram of an electrical connection structure of another closed circuit composed of a key and a lock core mating together according to an embodiment of the present disclosure.

As shown in FIG. 8, in a specific implementation, the rectifying component 4 and the filtering component 5 disposed in the key can also be disposed in the lock core. The rectifying component 4 and the filtering component 5 are connected in series between the second cathode component 22 and the second piezoelectric electrode 23. The functions and effects of the rectifying component 4 and the filtering component 5 have been described in the above embodiments, and are not described herein again.

As shown in FIG. 8, in a specific implementation, the lock core according to the embodiment of the present disclosure further includes: a transformer unit 6. The transformer unit 6 has one input end connected to the second piezoelectric electrode 23, the other input end for connecting to the first piezoelectric electrode 13 of the key, one output end connected to the second cathode component 22, and the other output end for connecting to the first cathode component 12 of the key.

By means of the voltage regulating function of the transformer unit 6, the voltage can be adjusted to a suitable output voltage (1-3V) to meet the requirements of driving the light emitting component 11.

As shown in FIG. 8, in a specific implementation, the storage capacitor 7 disposed in the key can also be disposed in the lock core, and the storage capacitor 7 is connected between the second cathode component 22 and the second piezoelectric electrode 23. The storage capacitor 7 can store a certain amount of electric energy to drive the load, that is, to meet the driving requirements of the control chip 3 and the light emitting component 11. Thus, the problem that the current is unstable or the power may be insufficient can be solved.

A still another embodiment of the present disclosure provides a lock, including a lock core. As shown in FIG. 1 to FIG. 3, the lock core includes: a body 2, the second cathode component 22, and the second piezoelectric electrode 23. The body 2 is provided with a lock hole 21. The lock hole 21 is configured to be mated with the column body 1 of the key. The bottom of the lock hole 21 is provided with a photosensitive sensing device 25. The second cathode component 22 is disposed on the inner wall of the lock hole 21 and configured to be mated with the first cathode component 12 on the key. The surface of the second piezoelectric electrode 23 is provided with a polymer insulating layer 24, and the second piezoelectric electrode 23 is disposed on the inner wall of the lock hole 21 and connected to the second cathode component 22, and configured to be pressed against the first piezoelectric electrode 13 on the key. When the second cathode component 22 is mated with the first cathode component 12 of the key, and the second piezoelectric electrode 23 is pressed against the first piezoelectric electrode 13 of the key, a closed circuit is formed and a piezoelectric current is generated. The light emitting component 11 of the key emits a light signal, and the photosensitive sensing device 25 receives the light signal and converts it into a control signal output to the lock for controlling the locking and unlocking of the lock.

As an example, the lock core can be the lock core according to the above embodiment. For the specific implementation structure, reference can be made to the related content described in the foregoing embodiment, and details are not described herein again.

It should be noted that in the key and lock used in cooperation according to the present disclosure, the transformer unit and the storage capacitor can be disposed on one of them.

The above description is only a preferred embodiment of the present disclosure, and is not intended to limit the present disclosure in any way. Any simple variations, equivalent changes and modifications made to the above embodiments in accordance with the technical essence of the present disclosure are still within the scope of the technical solutions of the present disclosure.

What is claimed is:
1. A key, comprising:
a column body configured to be mated with a lock hole of a lock core;
a light emitting component disposed at a first end of the column body;
a first cathode component disposed on the column body and connected to the first end of the light emitting component, and configured to be mated with a second cathode component in the lock core;
at least one first piezoelectric electrode disposed on the column body and connected to a second end of the light emitting component, and configured to be pressed against a second piezoelectric electrode in the lock core;
wherein, when the first cathode component is mated with the second cathode component in the lock core and the first piezoelectric electrode is pressed against the second piezoelectric electrode in the lock core, a closed circuit is formed and a piezoelectric current is generated, to drive the light emitting component to emit light.

2. The key according to claim 1, wherein
the first cathode component is disposed on the column body and between the first piezoelectric electrode and the second end of the column body, the second end of the column body being opposite to the first end.

3. The key according to claim 2, further comprising:
a plurality of first piezoelectric electrodes disposed with intervals around the column body.

4. The key according to claim 2, wherein the at least one first piezoelectric electrode is a flange disposed along a circumference on outer surface of the column body.

5. The key according to claim 2, wherein the at least one first piezoelectric electrode is connected to the column body in an elastically contractible manner, and the first piezoelectric electrode contracts inside the column body under pressure.

6. The key according to claim 3, further comprising:
a first guiding structure disposed between the first piezoelectric electrode and the first end of the column body, and configured to match with a second guiding structure in the lock core.

7. The key according to claim 1, wherein
the first piezoelectric electrode is provided with an elastic member for elastically supporting between the first piezoelectric electrode and the second piezoelectric electrode.

8. The key according to claim 1, further comprising:
a control chip disposed in the column body, wherein an input end of the control chip is connected to the first piezoelectric electrode, and an output end of the control chip is connected to the light emitting component.

9. The key according to claim 1, further comprising:
a transformer unit comprising a rectifying component and a filtering component, wherein one input end of the transformer unit is connected to the first piezoelectric electrode, and the other input end of the transformer unit is connected to the second piezoelectric electrode of the lock core, one output end of the transformer unit is connected to the first cathode component, and the other output end of the transformer unit is for connecting to the second cathode component of the lock core; and
a storage capacitor connected between the first cathode component and the first piezoelectric electrode.

10. The key according to claim 1, further comprising: a fingerprint identification component disposed at a second end of the column body, wherein the fingerprint identification component is connected between the first piezoelectric electrode and the first cathode component.

11. The key according to claim 1, further comprising:
a condensing lens disposed on a surface of the light emitting component so that light emitted by the light emitting component is irradiated in the lock core.

12. A lock core comprising:
a body, provided with a lock hole, the lock hole being configured to be mated with a column body of a key;
a photo sensor disposed at a bottom of the lock hole;
a second cathode component disposed on an inner wall of the lock hole and configured to be mated with a first cathode component on the key;
at least one second piezoelectric electrode having a polymer insulating layer disposed on a surface thereof, disposed on an inner wall of the lock hole, connected to the second cathode component, and configured to be pressed against a first piezoelectric electrode on the key;
wherein, when the second cathode component is mated with the first cathode component in the lock core, and the second piezoelectric electrode is pressed against the first piezoelectric electrode of the key, a closed circuit is formed and a piezoelectric current is generated, to drive the light emitting component of the key to emit light, the light signal is received by the photo sensor and converted to a control signal to be output to the lock for controlling the locking and unlocking of the lock.

13. The lock core according to claim 12, wherein
the second cathode component is disposed on the inner wall of the lock hole and between the second piezoelectric electrode and an opening of the lock hole.

14. The lock core according to claim 13, wherein
the lock core comprises a plurality of second piezoelectric electrodes, and the plurality of second piezoelectric electrodes are disposed with intervals around the inner wall of the lock hole.

15. The lock core according to claim 13, wherein the plurality of second piezoelectric electrodes is a flange disposed along a circumference of the inner wall of the lock hole.

16. The lock core according to claim 13, wherein the at least one second piezoelectric electrode is connected to the inner wall of the lock hole in an elastically contractible manner, and contracts inside the inner wall of the lock hole under pressure.

17. The lock core according to claim 14, further comprising:
a second guiding structure disposed between the second piezoelectric electrode and the open end of the lock hole, and configured to match with a first guiding structure on the key.

18. The lock core according to claim 12, further comprising:
a control chip disposed in the body, wherein an input end of the control chip is connected to the second piezoelectric electrode, and an output end of the control chip is connected to the second cathode component.

19. The lock core according to claim 12, further comprising:
a transformer unit comprising a rectifying component and a filtering component, wherein one input end of the transformer unit is connected to the second piezoelectric electrode, and the other input end of the transformer unit is for connecting to the first piezoelectric electrode of the key, one output end of the transformer unit is connected to the second cathode component, and the other output end of the transformer unit is for connecting to the first cathode component of the key; and
a storage capacitor connected between the second cathode component and the second piezoelectric electrode.

20. A lock comprising the lock core according to claim 13.

* * * * *